(12) United States Patent
Lo et al.

(10) Patent No.: US 11,081,340 B2
(45) Date of Patent: *Aug. 3, 2021

(54) ARGON ADDITION TO REMOTE PLASMA OXIDATION

(71) Applicant: Applied Materials, Inc., Santa Clara, CA (US)

(72) Inventors: Hansel Lo, San Jose, CA (US); Christopher S. Olsen, Fremont, CA (US); Eric Kihara Shono, San Mateo, CA (US); Johanes S. Swenberg, Los Gatos, CA (US); Erika Hansen, San Jose, CA (US); Taewan Kim, San Jose, CA (US); Lara Hawrylchak, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/849,713

(22) Filed: Apr. 15, 2020

(65) Prior Publication Data

US 2020/0251331 A1 Aug. 6, 2020

Related U.S. Application Data

(62) Division of application No. 16/226,862, filed on Dec. 20, 2018, now Pat. No. 10,636,650.

(Continued)

(51) Int. Cl.
*H01L 27/11582* (2017.01)
*H01L 21/02* (2006.01)
(Continued)

(52) U.S. Cl.
CPC .... *H01L 21/02252* (2013.01); *H01J 37/3244* (2013.01); *H01J 37/32357* (2013.01);
(Continued)

(58) Field of Classification Search
CPC ......... H01L 21/02252; H01L 21/02164; H01L 21/02236; H01L 21/02332; H01L 21/0234;
(Continued)

(56) References Cited

U.S. PATENT DOCUMENTS

| 7,501,352 B2 | 3/2009 | Igeta et al. |
| 8,236,706 B2 | 8/2012 | Peuse et al. |

(Continued)

FOREIGN PATENT DOCUMENTS

| JP | 2008-535243 A | 8/2008 |
| KR | 10-2011-0104001 A | 9/2011 |

(Continued)

OTHER PUBLICATIONS

International Search Report and Written Opinion for International Application No. PCT/US2018/066650 dated Apr. 15, 2019.

(Continued)

*Primary Examiner* — Timor Karimy
(74) *Attorney, Agent, or Firm* — Patterson + Sheridan, LLP

(57) ABSTRACT

Methods for conformal radical oxidation of structures are provided. The method comprises positioning a substrate in a processing region of a processing chamber. The method further comprises flowing hydrogen gas into a precursor activator at a first flow rate, wherein the precursor activator is fluidly coupled with the processing region. The method further comprises flowing oxygen gas into the precursor activator at a second flow rate. The method further comprises flowing argon gas into the precursor activator at a third flow rate. The method further comprises generating a plasma in the precursor activator from the hydrogen gas, oxygen gas, and argon gas. The method further comprises flowing the plasma into the processing region. The method (Continued)

further comprises exposing the substrate to the plasma to form an oxide film on the substrate, wherein a growth rate of the oxide film is controlled by adjusting the third flow rate.

20 Claims, 6 Drawing Sheets

Related U.S. Application Data

(60) Provisional application No. 62/617,387, filed on Jan. 15, 2018.

(51) Int. Cl.
*H01J 37/32* (2006.01)
*H01L 21/311* (2006.01)

(52) U.S. Cl.
CPC .... *H01L 21/0234* (2013.01); *H01L 21/02164* (2013.01); *H01L 21/02236* (2013.01); *H01L 21/02326* (2013.01); *H01L 21/02332* (2013.01); *H01L 21/311* (2013.01); *H01L 27/11582* (2013.01)

(58) Field of Classification Search
CPC .............. H01L 21/311; H01L 27/11582; H01J 37/32357; H01J 37/3244
See application file for complete search history.

(56) References Cited

U.S. PATENT DOCUMENTS

| | | | |
|---|---|---|---|
| 8,492,292 B2 | 7/2013 | Yokota et al. | |
| 8,916,484 B2 | 12/2014 | Olsen et al. | |
| 9,502,262 B2 | 11/2016 | Chen et al. | |
| 9,685,320 B2 | 6/2017 | Kang et al. | |
| 9,865,464 B2 | 1/2018 | Chen et al. | |
| 10,246,772 B2 | 4/2019 | Jha et al. | |
| 10,636,650 B2 * | 4/2020 | Lo .................... | H01J 37/32357 |
| 2011/0281440 A1 | 11/2011 | Porshnev | |
| 2013/0109164 A1 | 5/2013 | Olsen et al. | |
| 2014/0034632 A1 | 2/2014 | Pan et al. | |
| 2016/0020092 A1 | 1/2016 | Kang et al. | |
| 2016/0064500 A1 | 3/2016 | Chen et al. | |
| 2016/0163539 A9 | 6/2016 | Kang et al. | |
| 2016/0293609 A1 | 10/2016 | Jha et al. | |
| 2017/0011931 A1 | 1/2017 | Park et al. | |
| 2017/0178894 A1 | 6/2017 | Stone et al. | |
| 2017/0229337 A1 | 8/2017 | Park et al. | |
| 2017/0316930 A1 | 11/2017 | Pan et al. | |
| 2017/0352546 A1 | 12/2017 | Gupta et al. | |
| 2018/0076026 A1 | 3/2018 | Olsen et al. | |

FOREIGN PATENT DOCUMENTS

| | | |
|---|---|---|
| TW | 201618189 A | 5/2016 |
| TW | 201700766 A | 1/2017 |
| TW | 201739038 A | 11/2017 |
| WO | 2017-210141 A1 | 12/2017 |

OTHER PUBLICATIONS

Search Report for Taiwan Application No. 107146721 dated Sep. 24, 2019.
Office Action for Taiwan Application No. 109118734 dated May 6, 2021.
Search Report for Taiwan Application No. 109118734 dated May 5, 2021.

* cited by examiner

ARGON ADDITION TO REMOTE PLASMA OXIDATION

CROSS-REFERENCE TO RELATED APPLICATIONS

This application is a divisional of co-pending U.S. patent application Ser. No. 16/226,862, filed Dec. 20, 2018, which claims benefit of U.S. provisional patent application Ser. No. 62/617,387, filed Jan. 15, 2018, both of which are incorporated herein by reference in their entirety.

BACKGROUND

Field

Implementations of the present disclosure generally relate to semiconductor device fabrication and in particular to methods for conformal radical oxidation of structures such as high aspect ratio structures.

Description of the Related Art

The production of silicon integrated circuits has placed difficult demands on fabrication processes to increase the number of devices while decreasing the minimum feature sizes on a chip. These demands have extended to fabrication processes including depositing layers of different materials onto difficult topologies and etching further features within those layers. Manufacturing processes for next generation NAND flash memory involve especially challenging device geometries and scales. NAND is a type of non-volatile storage technology that does not have need of power to retain data. To increase memory capacity within the same physical space, a three-dimensional NAND (3D NAND) design has been developed. Such a design typically introduces alternating oxide layers and nitride layers, which are deposited on a substrate. The alternating oxide layers and nitride layers are then etched producing a structure having one or more surfaces extending substantially perpendicular to the substrate. Such design considerations have moved the field from oxidation of relatively low aspect ratio structures, for example 10:1 aspect ratios, to high aspect ratio (HAR) structures, for example 40:1 or greater aspect ratios. Prior fabrication processes have included methods for filing gaps and trenches in HAR structures.

3D NAND flash structures are often coated with silicon nitride ($Si_xN_y$) layers, for example, $Si_3N_4$, that are to be oxidized conformally in HAR structures. 3D NAND flash structures may have high or ultra-high aspect ratios, for example, a 40:1 aspect ratio, between a 40:1 and a 100:1 aspect ratio, a 100:1 aspect ratio, or even greater than 100:1 aspect ratio. New fabrication processes are looked-for for conformal deposition of layers on the faces of HAR structures, rather than simply filling gaps and trenches. For example, forming layers conformally onto the face of a HAR structure may involve slower deposition rates. "Conformally" generally refers to uniform and/or constant-thickness layers on faces of structures. In the context of HAR structures, "conformally" may be most relevant when discussing the thickness of oxidation on the structure faces that are substantially perpendicular to the substrate. A more conformal deposition can reduce material build up at the top of the structure. Such material build up may result in material prematurely sealing off the top of the trench between adjacent structures, forming a void in the trench. Unfortunately, slowing the deposition rate also means increasing the deposition time, which reduces processing efficiency and production rates.

Thus, there is a need for improved processes for conformal oxidation of high aspect ratio structures.

SUMMARY

Implementations of the present disclosure generally relate to semiconductor device fabrication and in particular to methods for conformal radical oxidation of structures such as high aspect ratio structures. In one implementation, a method for oxidation is provided. The method comprises flowing hydrogen gas into a processing region of a processing chamber at a first flow rate, wherein the processing region has a substrate positioned therein. The method further comprises flowing oxygen gas into a precursor activator at a second flow rate. The method further comprises flowing argon gas into the precursor activator at a third flow rate. The method further comprises generating a plasma in the precursor activator from the oxygen gas and argon gas. The method further comprises flowing the plasma into the processing region where the plasma mixes with the hydrogen gas to create an activated processing gas. The method further comprises exposing the substrate to the activated gas to form an oxide film on the substrate, wherein a growth rate of the oxide film is controlled by adjusting the third flow rate.

In another implementation, a method for oxidation is provided. The method comprises positioning a substrate in a processing region of a processing chamber. The method further comprises flowing hydrogen gas into a precursor activator at a first flow rate, wherein the precursor activator is fluidly coupled with the processing region. The method further comprises flowing oxygen gas into the precursor activator at a second flow rate. The method further comprises flowing argon gas into the precursor activator at a third flow rate. The method further comprises generating a plasma in the precursor activator from the hydrogen gas, oxygen gas, and argon gas. The method further comprises flowing the plasma into the processing region. The method further comprises exposing the substrate to the plasma to form an oxide film on the substrate, wherein a growth rate of the oxide film is controlled by adjusting the third flow rate.

In yet another implementation, a method for oxidation is provided. The method comprises positioning a substrate in a processing region of a processing chamber. The method further comprises flowing hydrogen gas into a precursor activator at a first flow rate, wherein the precursor activator is fluidly coupled with the processing region. The method further comprises flowing oxygen gas into the precursor activator and into the processing region at a second flow rate. The method further comprises flowing argon gas into the precursor activator and into the processing region at a third flow rate. The method further comprises generating a plasma in the precursor activator from the hydrogen gas, oxygen gas, and argon gas. The method further comprises flowing the plasma into the processing region. The method further comprises exposing the substrate to the plasma to form an oxide film on the substrate, wherein a growth rate of the oxide film is controlled by adjusting the third flow rate.

In yet another implementation, a method for oxidation is provided. The method comprises flowing hydrogen gas into a processing region of a processing chamber at a first flow rate, wherein the processing region has a substrate positioned therein. The method further comprises flowing hydrogen gas into a precursor activator at a second flow rate, wherein the precursor activator is fluidly coupled with the processing region. The method further comprises flowing oxygen gas into the precursor activator and into the processing region at a third flow rate. The method further comprises flowing argon gas into the precursor activator and into the processing region at a fourth flow rate. The method further comprises generating a plasma in the precursor activator from the hydrogen gas, oxygen gas, and argon gas. The method further comprises flowing the plasma into the processing region where the plasma mixes with the hydrogen gas to create an activated processing gas. The method further comprises flowing the plasma into the processing region.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
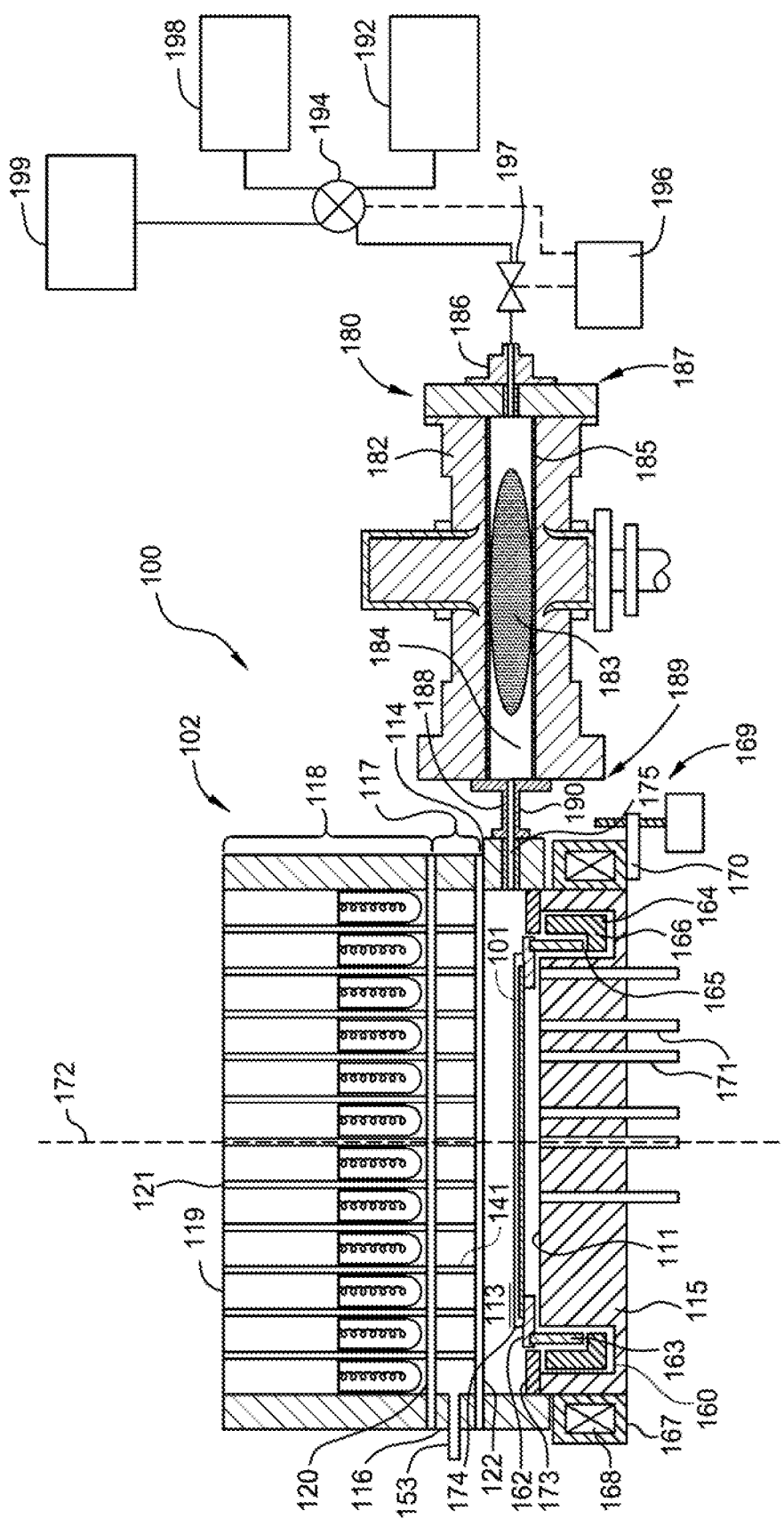
FIG. 1 is a cross-sectional view of a remote plasma system according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods for oxidizing silicon films. Certain details are set forth in the following description and in FIGS. 1-6 to provide a thorough understanding of various implementations of the disclosure. Other details describing well-known structures and systems often associated with remote plasma oxidation are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a remote plasma oxidation process. The apparatus description described herein is illustrative and should not be construed or interpreted as limiting the scope of the implementations described herein. Other tools capable of performing remote plasma oxidation processes may also be adapted to benefit from the implementations described herein.

As the aspect ratio of HAR structures continues to increase, it becomes increasingly difficult to grow conformal films within these HAR structures. For example, oxide films formed in HAR structures by currently available remote plasma oxidation processes have insufficient conformality for HAR structures as well as high pattern loading (e.g., non-uniformity on patterned wafers compared to bare silicon wafers). It has been found by the inventors that argon addition during some implementations of remote plasma oxidation can improve conformal oxidation growth while improving pattern loading. Not to be bound by theory but it is believed that the addition of argon gas reduces the recombination of oxygen radicals, which increases the concentration of oxygen radicals available for the plasma oxidation process. Thus, argon gas can be used to control the growth rate of an oxide film. For example, an increase in the flow of argon gas will typically yield an increase in the growth rate of the oxide film, whereas a decrease in the flow of argon gas will typically yield a decrease in the growth rate of the oxide film. In addition, argon addition improves strike reliability as argon has lower ionization energy and thus leads to easier plasma formation.

The methods described herein may be performed using a plasma source, for example a remote plasma source (RPS), and a processing chamber designed to perform atomic oxygen radical (O) growth (e.g., conformal radical oxidation) in high aspect ratio (HAR) structures, for example trench capacitor dielectrics, gate dielectrics, and 3D NAND flash structures. In some implementations, the plasma source utilizes a gas mixture of argon, oxygen and optionally hydrogen to initiate radical oxidation of a silicon-containing material, such as a silicon nitride ($Si_xN_y$) material, for example $Si_3N_4$. In some implementations, the gas mixture of argon, oxygen, and optionally hydrogen has a concentration of argon in the range of about 5% to about 80%, for example, in the range of about 10% to about 50%. In some implementations, the plasma initiates a reaction to form silicon oxynitride ($SiO_xN_y$), for example, $Si_2N_2O$, as an intermediary to forming silica ($SiO_2$).

In some implementations, combinations of argon, hydrogen, and oxygen in a precursor activator, in some cases with post activator hydrogen injection, during high temperature processing (for example, ~500 to 1100 degrees Celsius) delivers highly conformal oxidation growth of films (e.g. amorphous silicon, polysilicon, or silicon nitride) in very high aspect ratio structures (for example, a 40:1 aspect ratio, between a 40:1 and a 100:1 aspect ratio, a 100:1 aspect ratio, or even greater than 100:1 aspect ratio.)

In some implementations, combinations of argon, hydrogen, and oxygen in a precursor activator, in some cases with post activator hydrogen injection, during high temperature processing (for example, 500 to 1100 degrees Celsius) delivers improved oxide quality and/or prevents degraded quality.

FIG. 1 illustrates a substrate processing system 100 that may be used to perform the methods described herein. Other deposition chambers may also benefit from the present disclosure and the parameters disclosed herein may vary according to the particular deposition chamber used to form the HAR structures described herein. For example, other deposition chambers may have a larger or smaller volume, requiring gas flow rates that are larger or smaller than the gas flow rates recited for deposition chambers available from Applied Materials, Inc.

The substrate processing system 100 includes a thermal processing chamber 102 and a precursor activator 180 that couples to the thermal processing chamber 102 and is used to remotely provide radicals of a plasma to the processing region 113 of the thermal processing chamber 102. The precursor activator 180 can also be used to provide an activated gas mixture that is not a plasma, for example by applying energy to a gas that does not significantly ionize the gas. The thermal processing chamber 102 has a processing region 113 enclosed by one or more sidewall(s) 114 (e.g., four sidewall) and a base 115. The upper portion of sidewall 114 may be sealed to a window assembly 117 (e.g., using "O" rings). A radiant energy assembly 118 is positioned over and coupled to window assembly 117. The radiant energy assembly 118 has a plurality of lamps 119, which may be tungsten halogen lamps, each mounted into a receptacle 121 and positioned to emit electromagnetic radiation into the processing region 113. The window assembly 117 of FIG. 1 has a plurality of light pipes 141, but the window assembly 117 may just have a flat, solid window with no light pipes. The window assembly 117 has an outer wall 116 (e.g., a cylindrical outer wall) that forms a rim enclosing the window assembly 117 around a circumference thereof. The window assembly 117 also has a first window 120 covering a first end of the plurality of light pipes 141 and a second window 122 covering a second end of the plurality of light pipes 141, opposite the first end. The first window 120 and second window 122 extend to, and engage with, the outer wall 116 of the window assembly 117 to enclose and seal the interior of the window assembly 117, which includes the plurality of light pipes 141. In such cases, when light pipes are used, a vacuum can be produced in the plurality of light pipes 141 by applying vacuum through a conduit 153 through the outer wall 116 to one of the plurality of light pipes 141, which is in turn fluidly connected to the rest of the pipes.

A substrate 101 is supported in the thermal processing chamber 102 by a support ring 162 within the processing region 113. The support ring 162 is mounted on a rotatable cylinder 163. By rotating the rotatable cylinder 163, the support ring 162 and substrate 101 are caused to rotate during processing. The base 115 of the thermal processing chamber 102 has a reflective surface 111 for reflecting energy onto the backside of the substrate 101 during processing. Alternatively, a separate reflector (not shown) can be positioned between the base 115 of the thermal processing chamber 102 and the support ring 162. The thermal processing chamber 102 may include a plurality of temperature probes 171 disposed through the base 115 of the thermal processing chamber 102 to detect the temperature of the substrate 101. In the event a separate reflector is used, as described above, the temperature probes 171 are also disposed through the separate reflector for optical access to electromagnetic radiation coming from the substrate 101.

The rotatable cylinder 163 is supported by a magnetic rotor 164, which is a cylindrical member having a ledge 165 on which the rotatable cylinder 163 rests when both members are installed in the thermal processing chamber 102. The magnetic rotor 164 has a plurality of magnets in a magnet region 166 below the ledge 165. The magnetic rotor 164 is disposed in an annular well 160 located at a peripheral region of the thermal processing chamber 102 along the base 115. A cover 173 rests on a peripheral portion of the base 115 and extends over the annular well 160 toward the rotatable cylinder 163 and support ring 162, leaving a tolerance gap between the cover 173 and the rotatable cylinder 163 and/or the support ring 162. The cover 173 generally protects the magnetic rotor 164 from exposure to process conditions in the processing region 113.

The magnetic rotor 164 is rotated by magnetic energy from a magnetic stator 167 disposed around the base 115. The magnetic stator 167 has a plurality of electromagnets 168 that, during processing of the substrate 101, are powered according to a rotating pattern to form a rotating magnetic field that provides magnetic energy to rotate the magnetic rotor 164. The magnetic stator 167 is coupled to a linear actuator 169, which in this case is a screw drive, by a support 170. Operating the linear actuator 169 moves the magnetic stator 167 along an axis 172 of the thermal processing chamber 102, which in turn moves the magnetic rotor 164, the rotatable cylinder 163, the support ring 162, and substrate 101 along the axis 172.

Processing gas is provided to the thermal processing chamber 102 through a chamber inlet 175, and exhausts through a chamber outlet oriented out of the page and generally along the same plane as the chamber inlet 175 and the support ring 162 (not shown in FIG. 1). Substrates enter and exit the thermal processing chamber 102 through an access port 174 formed in the sidewall 114 and shown at the rear in FIG. 1. The substrate transportation process is not described herein.

The precursor activator 180 has a body 182 surrounding an interior space 184 where a plasma 183 of ions, radicals, and electrons can be formed. A liner 185 made of quartz or sapphire protects the body 182 from chemical attack by the plasma. The interior space 184 preferably does not have any electrical potential gradient present that might attract charged particles, e.g., ions. A gas inlet 186 is disposed at a first end 187 of the body 182 and opposite from a gas outlet 188 that is located at a second end 189 of the body 182. When the precursor activator 180 is coupled to the thermal processing chamber 102, the gas outlet 188 is in fluid communication with the thermal processing chamber 102 through a delivery line 190 to chamber inlet 175, such that radicals of the plasma 183 generated within the interior space 184 are supplied to the processing region 113 of the thermal processing chamber 102. The gas outlet 188 may have a diameter larger than the gas inlet 186 to allow the excited radicals to be efficiently discharged at a targeted flow rate, and to minimize the contact between the radicals and the liner 185. If targeted, a separate orifice may be inserted within the liner 185 at the gas outlet 188 to reduce an inner dimension of the interior space 184 at the gas outlet 188. The diameter of the gas outlet 188 (or orifice, if used) can be selected to provide a pressure differential between the processing region 113 and the precursor activator 180. The pressure differential may be selected to yield a composition of ions, radicals, and molecules flowing in to the thermal processing chamber 102 that is suitable to processes being performed in the thermal processing chamber 102.

To provide gas for plasma processing, a first gas source 192 is coupled to the gas inlet 186 via a first input of a four-way valve 194 and a valve 197 used to control the flow rate of gas released from the first gas source 192. A second input of the four-way valve 194 may be coupled to a second gas source 198. A third input of the four-way valve may be coupled to a third gas source 199. Each of the first gas source 192, the second gas source 198, and the third gas source 199 may be, or include, one or more of a nitrogen-containing gas, an oxygen-containing gas, a silicon-containing gas, a hydrogen-containing gas, or a plasma forming gas such as argon or helium. A flow controller 196 is connected to the four-way valve 194 to switch the four-way valve 194 between its different positions, depending upon which process is to be carried out. The flow controller 196 also controls switching of the four-way valve 194.

The precursor activator 180 may be coupled to an energy source (not shown) to provide an excitation energy, such as an energy having a microwave or RF frequency, to the precursor activator 180 to activate the process gas traveling from the first gas source 192 into the plasma 183. In the case where nitrogen-containing gas, for example, $N_2$, is used, the plasma activation in precursor activator 180 produces $N^*$ radicals, positively charged ions such as $N^+$ and $N_2^+$, and electrons in the interior space 184. By locating the precursor activator 180 remotely from the processing region 113 of thermal processing chamber 102, exposure of the substrate to ions can be minimized. Ions can damage sensitive structures on a semiconductor substrate, whereas radicals are reactive and can be used to perform beneficial chemical reactions. Use of an activated gas source such as the precursor activator 180 promotes exposure of the substrate 101 to radicals and minimizes exposure of the substrate 101 to ions.

In some implementations, a second hydrogen gas source (not shown) is fluidly coupled with the thermal processing chamber 102. The second hydrogen gas source delivers hydrogen gas to the processing region 113 where the hydrogen gas is activated by the remote plasma comprising oxygen and argon delivered from the precursor activator 180 to the processing region 113. In some implementations where a high percentage of hydrogen gas is targeted, hydrogen gas may be supplied to the processing region 113 through both the third gas source 199 and the second hydrogen gas source.

In some implementations, a second argon gas source (not shown) is coupled with the thermal processing chamber 102. The second argon gas source delivers argon gas to the processing region 113 where the argon gas is activated by the remote plasma delivered from the precursor activator 180 to the processing region 113. In some implementations where a high percentage of argon gas is targeted, argon gas may be supplied to the processing region 113 through both the second gas source 198 and the second argon gas source.

Figure 2:
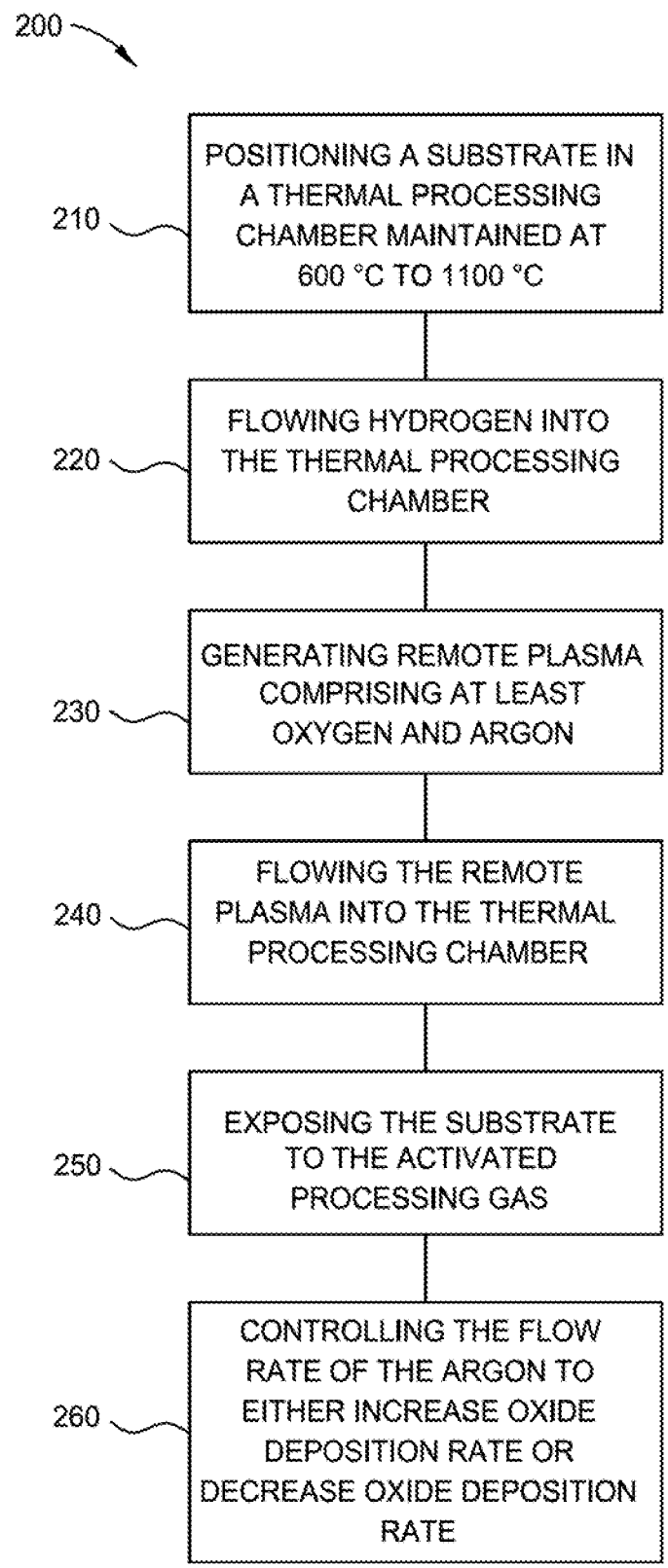
FIG. 2 is a process flow diagram of a method of selective oxidation according to one or more implementations of the present disclosure.
Figure 3A:
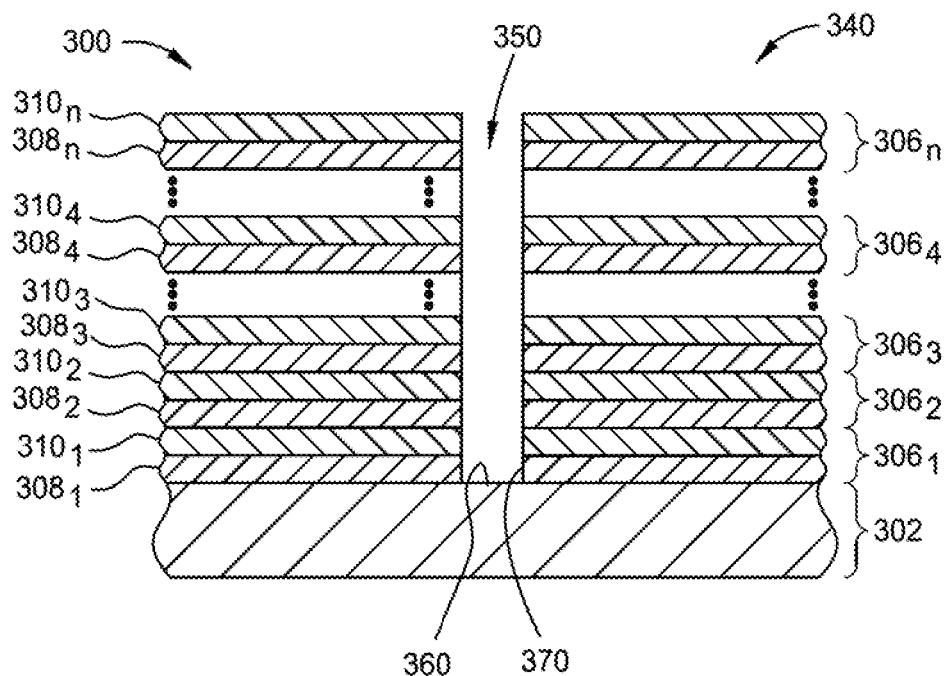
FIG. 3A depicts a cross-sectional view of a film structure having a high aspect ratio feature that may be processed according to one or more implementations of the present disclosure.
Figure 3B:
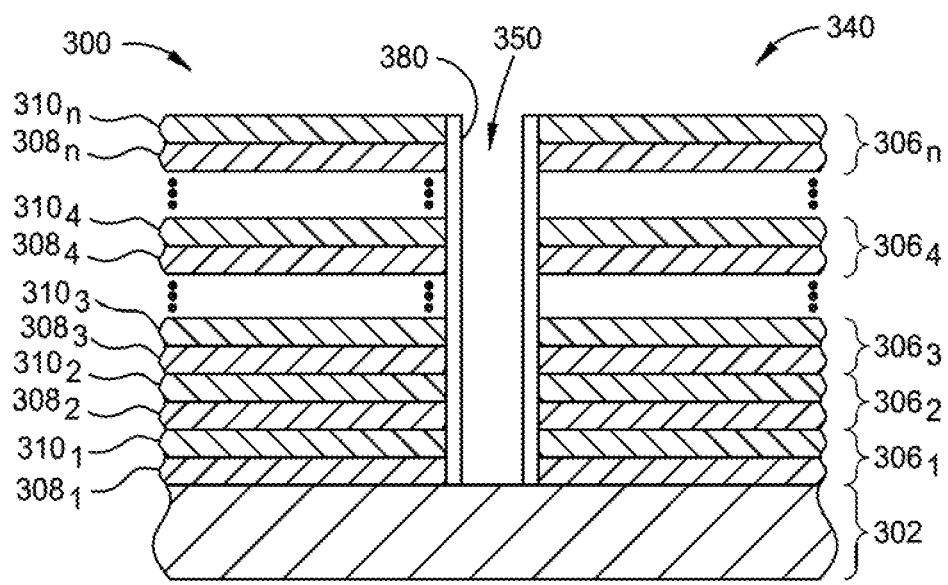
FIG. 3B depicts a cross-sectional view of the film structure of FIG. 3A having a conformal oxide layer formed according to one or more implementations of the present disclosure.

FIG. 2 is a process flow diagram of a method 200 of oxidation according to one or more implementations of the present disclosure. The method 200 may be used to oxidize films, such as, for example, amorphous silicon films, polysilicon films, silicon nitride films, alumina films, silicon oxide films, and the like. FIG. 3A depicts a cross-sectional view of a film structure having a high aspect ratio feature that may be processed according to the method 200. FIG. 3B depicts a cross-sectional view of the film structure of FIG. 3A having a conformal oxide layer formed according to the method 200. Although the method 200 is described below with reference to a high aspect ratio structure that may be formed on a film stack utilized to manufacture stair-like structures in the film stack for three dimensional semiconductor devices, the method 200 may also be used to advantage in other device manufacturing applications. For example, the method 200 may also be used to advantage for DRAM (e.g., recessed channel array transistor "RCAT"). Further, it should also be understood that the operations depicted in FIG. 2 may be performed simultaneously and/or in a different order than the order depicted in FIG. 2. Additionally, the method 200 may be used to advantage for selective oxidation and non-selective oxidation of films.

The method 200 begins at operation 210 by positioning a substrate into a process chamber, such as the thermal processing chamber 102 depicted in FIG. 1. The substrate may be the substrate 302 having a film structure 300 formed thereon, or any subset of the film structure 300. The substrate 302 without a film structure (i.e. just the substrate 302) may also be processed according to the method 200. The film structure 300 may have a high aspect ratio feature 340 formed therein. The faces that define the high aspect ratio feature 340 here are substantially perpendicular to the substrate 302, but other types of features having tapered, angled, slanted, or curved faces can be processed using the method 200. Note that the high aspect ratio feature 340 provides access to the faces of the HAR structures, for example for gas transmission and/or reactant removal. As aspect ratio increases, the surface area of the HAR structures and the depth of the features likewise increase. As aspect ratio increases, conformal radical oxidation of the faces of the HAR structures is increasingly hampered by oxygen radical depletion, especially near the bottom of the high aspect ratio feature 340. This oxygen radical depletion leads to an increase in incubation time and a corresponding decrease in growth rate of the conformal oxide film. As disclosed herein, argon addition to the radical plasma oxidation process reduces oxygen recombination near the bottom of the high aspect ratio feature 340, which increases the availability of oxygen radicals for conformal radical oxidation leading to an increased growth rate of the conformal oxide film. While activated argon can be deactivated by reaction with other species in the high aspect ratio feature 340, activated argon is not further consumed by attachment to the surfaces of the high aspect ratio feature 340. As a result, more activated argon can penetrate to the bottom of the high aspect ratio feature 340 to react with, and reactivate, gas phase oxygen, and other species such as hydrogen, that might have been deactivated in transit to the high aspect ratio feature 340. The activated argon thus adds chemical potential energy to the gas mixture in the high aspect ratio feature 340, increasing overall reactivity, especially at the bottom of the high aspect ratio feature 340.

Although only one high aspect ratio feature 340 is shown in FIG. 3, it should be understood that the method 200 can be used with substrates having multiple high aspect ratio features formed in the film structure 300. In some implementations, the film structure 300 may include gate structures, or precursor structures, for three-dimensional NAND semiconductor applications. In manufacturing three-dimensional NAND semiconductor applications, stair-like oxide-nitride pairs of structures are often utilized to form high aspect ratio gate stack NAND cells to increase circuit density.

The film structure 300 may be formed on a substrate 302. The film structure 300 has a plurality of material layer stacks $306_1, 306_2, 306_3, 306_4 \ldots 306_n$ (collectively 306) formed on the substrate 302 sequentially. Each material layer stack of the plurality of material layer stacks 306 may include a first film layer $308_1, 308_2, 308_3, 308_4 \ldots 308_n$ (collectively 308)

and a second film layer $310_1$, $310_2$, $310_3$, $310_4$ ... $310_n$ (collectively 310) formed thereon so that the film structure 300 includes a plurality of first film layers 308 and second film layers 310 formed in alternation. In some implementations, the plurality of first film layers 308 are silicon oxide layers and the plurality of second film layers 310 are silicon nitride layers. The plurality of material layer stacks 306 may be formed by PECVD deposition techniques in a plasma-processing chamber.

In further implementations, the first material layer/second material layer stacks can be oxide/silicon, silicon/doped silicon, or silicon/nitride. All of these combinations of materials can be used in Bit-Cost Scalable (BiCS), Terabit Cell Array Transistor (TCAT), DRAM, and other 3D memory structures. In other implementations, the first material layer and second material layer stacks can be other combinations of materials. The deposition order of the first film layers 308 and second film layers 310 on the substrate 302 can also be reversed.

The number of layers can depend upon the memory device being fabricated. In some implementations, the stack numbers could be 8×, or 16×, or 24×, or even higher, where each stack of 8, 16, 24, 32, 64, 128 or more layers corresponds to one memory device. The two layers of different materials form each stack, so the corresponding number of layers for an 8× stack number can be 16, a 16× stack number can have 32 layers, a 24× stack number can have 48 layers, and a higher stack number can have a respectively higher number of layers.

In some implementations, the substrate 302 may have a substantially planar surface, an uneven surface, or a substantially planar surface having a structure formed thereon. The substrate 302 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 302 may have various shapes and dimensions, such as 200 mm or 300 mm diameter wafers and rectangular or square panels. Unless otherwise noted, implementations and examples described herein refer to substrates having a 300 mm diameter. In some implementations, the substrate 302 may be a crystalline silicon substrate (e.g., monocrystalline silicon or polycrystalline silicon).

The high aspect ratio feature 340 has an opening 350. The high aspect ratio is defined by a bottom surface 360 and a sidewall 370. In some implementations, the bottom surface 360 is an exposed silicon or silicon-containing surface (e.g., monocrystalline silicon surface). In some implementations, the bottom surface 360 is an exposed germanium or germanium-containing surface. In some implementations, the bottom surface 360 is defined by an exposed surface of the substrate 302. In some implementations where the high aspect ratio feature 340 does not extend to the surface of the substrate 302, the bottom surface 360 may be defined by the material layer stacks 306 or a base layer, if present. The sidewall 370 is defined by the plurality of material layer stacks 306.

The methods described herein improve conformality of layers formed in the high aspect ratio feature 340 at aspect ratios (the ratio of the height of the bare hole divided by the width of the hole) of at least about 5:1 or more (e.g., an aspect ratio of 6:1 or more, 7:1 or more, 8:1 or more, 9:1 or more, 10:1 or more, 11:1 or more, 12:1 or more, 20:1 or more, 50:1 or more, 100:1 or more, 16:7 or more, or about 10:1 to about 20:1, or in the range of about 30:1 to about 50:1; or in the range of about 40:1 to about 100:1; or in the range of about 70:1 to about 100:1). Examples of feature definitions include channels, vias, trenches, gaps, lines, contact-holes, through-holes or other feature definitions utilized in a semiconductor, solar, or other electronic devices, such as high ratio contact plugs.

In some implementations, the substrate 302 is positioned in the processing region 113 under a non-reactive atmosphere and subjected to a temperature and pressure ramp-up process. Gases that are considered non-reactive include, but are not limited to, nitrogen gas ($N_2$), helium (He), argon (Ar), neon (Ne), and xenon (Xe). The hydrogen, argon, and/or oxygen containing gases may be fed into the processing region 113 prior to and/or during the ramping-up of temperature and pressure. The hydrogen, argon, and/or oxygen containing gases can be introduced directly into the processing region 113. In some implementations, the hydrogen, argon, and/or oxygen containing gases can be introduced into the processing region 113 via the precursor activator 180. In some implementations, the non-reactive atmosphere may be maintained during the ramp-up by flowing non-reactive gas into and out of the process chamber. Temperature and pressure may be ramped in any pattern, simultaneously or consecutively, up to the targeted predetermined process conditions.

In some implementations, the methods described herein are performed by maintaining a pressure in the processing region 113 less than 20 Torr, for example, between about 1 Torr to about 10 Torr (e.g., between about 2 Torr and about 8 Torr; between about 2 Torr and about 3 Torr, or between about 2.5 Torr and about 3 Torr). In some implementations, the methods described herein are performed by maintaining a substrate temperature between about 500 degrees Celsius and about 1100 degrees Celsius, for example, between about 600 degrees Celsius to about 1100 degrees Celsius; between about 700 degrees Celsius to about 800 degrees Celsius; or between about 750 degrees Celsius to about 800 degrees Celsius.

In some implementations, during processing, the chamber, the substrate, or both is maintained at a temperature between about 700 degrees Celsius to about 800 degrees Celsius and a chamber pressure between about 2 Torr and about 3 Torr.

At operation 220, the method 200 can further include flowing hydrogen gas into the processing region 113. In some implementations, the hydrogen gas is introduced directly into the processing region 113. In some implementations, the hydrogen gas is introduced into the processing region 113 via the precursor activator 180. In some implementations, hydrogen gas is introduced into the processing region 113 both directly and via the precursor activator 180. Hydrogen gas may be fed to the process chamber during the ramping-up of temperature and pressure or flowed after a set temperature is reached for better process control. In some implementations, the set temperature includes the substrate temperatures described above. Although hydrogen ($H_2$) gas is used, other gases, such as ammonia ($NH_3$) may be used.

For a 300 mm substrate in an appropriately sized chamber, the flow rates of $H_2$ can be from about 0.01 slm to about 20 slm (e.g., from about 1 slm to about 10 slm) for a 300 millimeter substrate. The hydrogen can be flowed into the chamber to maintain an overall chamber pressure of about 0.01 Torr to about 10 Torr (e.g., between about 0.5 Torr and about 8 Torr; between about 0.5 Torr and about 5 Torr; between about 2 Torr and about 3 Torr; or between about 2.5 Torr and about 3 Torr). In some implementations, the temperature of the substrate can be ramped to between about 500 degrees Celsius and about 1100 degrees Celsius, such as about 800 degrees Celsius.

In some implementations, at least one of oxygen and argon is introduced into the processing region 113 prior to generating plasma from the plasma precursor gas mixture at operation 230. The oxygen and/or argon can be introduced directly into the processing region 113. Alternately, the oxygen and/or argon can be introduced into the processing region 113 via the precursor activator 180. In some implementations, the oxygen and/or argon is introduced into the processing region 113 for a duration between about 5 seconds and about 30 seconds, for example about 15 seconds for a 300 mm substrate. The flowing of the oxygen and/or argon gas mixture prior to the introduction of the plasma species is believed to provide continuous thermal and pressure stabilization of the processing region 113. The stabilization process may be performed prior to operation 230, or may overlap with the operation 230.

At operation 230, the method 200 further includes generating a remote plasma from a plasma precursor gas mixture comprising at least oxygen gas, argon gas and optionally hydrogen gas. Although oxygen ($O_2$) gas is used, other gases, such as nitrous oxide ($N_2O$) may be used. In some implementations, the flow rate of the oxygen gas, the argon gas, and optionally hydrogen gas are ramped up to a set point to allow temperature, pressure, and flow controls to respond as the reaction begins. Not to be bound by theory, it is believed that inclusion of hydrogen in the plasma precursor gas mixture further improves the conformality of oxidation in HAR structures as well as increasing the growth rate of the oxide film. In some implementations, the remote plasma is generated in the precursor activator 180. Oxygen is supplied to the precursor activator 180 by the first gas source 192, argon gas is supplied to the precursor activator 180 by the second gas source 198, and hydrogen gas is supplied to the precursor activator 180 by the third gas source 199.

In operation 230, the oxygen gas is flowed into the precursor activator 180 at from about 0.01 slm to about 15 slm for a 300 millimeter substrate (e.g., from about 1 slm to about 10 slm for a 300 millimeter substrate). The oxygen gas can be mixed with argon gas and hydrogen gas to form the plasma precursor gas mixture. In some implementations, argon gas is flowed into the precursor activator 180 at from about 0.01 slm to about 15 slm for a 300 millimeter substrate (e.g., from about 1 slm to about 10 slm for a 300 millimeter substrate). In some implementations, hydrogen gas is flowed into the precursor activator 180 at from about 0.01 slm to about 20 slm (e.g., from about 1 slm to about 10 slm for a 300 millimeter substrate). In some implementations, the plasma precursor gas mixture includes an additional inert gas. The additional inert gas can include gases such as helium or krypton. The plasma precursor gas mixture can then be converted to plasma using an energy source. The energy source can be a RPS, magnetron typed plasma source, a Modified Magnetron Typed (MMT) plasma source, a remote plasma oxidation (RPO) source, a capcitively coupled plasma (CCP) source, an inductively coupled plasma (ICP) source, a microwave source, an ultraviolet radiation source, or a toroidal plasma source.

In some implementations where hydrogen is not included in the plasma, but is provided directly to the processing region 113, the plasma precursor gas mixture includes oxygen ($O_2$) and argon (Ar), and a concentration of argon up to about 55 percent provides a beneficial effect on film growth rate and conformality. Above about 55 percent, the beneficial effect may be realized to a lesser extent. The argon concentration, relative to the total of oxygen and argon, is at least 0.5 percent up to 55 percent, such as 20 percent to 50 percent, or 30 percent to 40 percent, for example 35 percent. In such cases, a concentration of oxygen in the plasma precursor gas is at least 19.5 percent up to 95.5 percent, such as 45 percent up to 95.5 percent, such as 50 percent to 80 percent, or 60 percent to 70 percent, for example 65 percent.

In some implementations, where the plasma precursor gas mixture includes oxygen ($O_2$), argon (Ar), and hydrogen ($H_2$), argon concentration, relative to the total of oxygen, argon, and hydrogen, is at least 0.5 percent up to 80 percent, such as 20 percent to 50 percent, or 30 percent to 40 percent, for example 35 percent. In such cases, a concentration of oxygen in the plasma precursor gas is at least 20 percent up to 95.5 percent, such as 45.5% to 90%, or 50 percent to 80 percent, or 60 percent to 70 percent, for example 60 percent. Also in such cases, hydrogen concentration, relative to the total of oxygen, argon, and hydrogen, is at least 0.5 percent up to 80 percent, such as 5 percent to 50 percent, or 10 percent to 40 percent, or 20 percent, to 30 percent, for example 5 percent.

In some implementations, the oxygen concentration ($O_2/(H_2+O_2)\%$) is about 20 percent or more.

The plasma precursor gas mixture is provided at total flow rate of between about 1,000 sccm and 50,000 sccm (e.g., between about 6,000 sccm and about 15,000 sccm; or between about 10,000 sccm and about 35,000 sccm; or between about 25,000 sccm and about 35,000 sccm) in the percentage ranges described above. For example, when both oxygen ($O_2$) and argon (Ar) are provided, the oxygen ($O_2$) and argon (Ar) is provided in a total flow rate of between about 10,000 sccm and about 50,000 sccm, especially between about 25,000 sccm and about 35,000 sccm, or at about 30,000 sccm, in the percentage ranges described above. Where the plasma forming gas includes oxygen ($O_2$), argon (Ar), and hydrogen ($H_2$), oxygen ($O_2$), argon (Ar), and hydrogen ($H_2$) are provided at a total flow rate of between about 10,000 sccm and about 50,000 sccm (e.g., between about 10,000 sccm and about 35,000 sccm; or between about 25,000 sccm and about 35,000 sccm) in the percentage ranges described above.

Gas flows for the operations described herein can be controlled by ratio. Ratio of argon to oxygen in the gas mixture affects the conformality and growth rate of layers formed in the processes described herein, and different ratios may achieve the most beneficial results in different processes. For the processes described herein, the gas flow ratio of oxygen gas to argon gas ($O_2$:Ar) is between 1:4 and 50:1 (e.g., 1:1 to 20:1; 1:1 to 5:1; or 5:1 to 10:1) is used.

Using the substrate processing system 100 of FIG. 1, the plasma precursor gas mixture is activated by exposure to RF power. Exposure to RF power ionizes at least a portion of the plasma precursor gas mixture, forming a plasma. RF power at a frequency between about 10 kHz and about 14 MHz is applied at a power level between about 1,000 W and about 5,000 W (e.g., between about 2,000 W and about 3,000 W, or about 2,500 W) to create the plasma. In one example, a frequency of 13.56 MHz is used. In another example, a lower frequency of 400 kHz is used. Alternately, the oxygen and argon gas mixture may be activated by exposure to a microwave source, for example a 2.45 GHz microwave source. The microwave source can be operated at a power level between about 1,000 W and 5,000 Watts, for example, 3,000 Watts depending on the gas flow rate through the microwave source and the degree of activation.

At operation 240, the method 200 further includes flowing the remote plasma into the processing chamber. In some implementations where hydrogen gas is present in the processing region 113, the remote plasma mixes with the hydrogen gas to create an activated processing gas. The plasma is mixed with the hydrogen over the substrate, creating H, O and OH species. In some implementations, where hydrogen is part of the plasma precursor gas, the remote plasma serves as the activated processing gas. When using plasma, residence time of the plasma in the interior space 184 and the delivery line 190, and activation extent can be selected to provide a targeted amount of quenching before the plasma reaches the processing region 113. As gas residence time increases at a given level of activation, higher plasma quenching is realized, and a less active gas is provided to the processing region 113. Similarly, as gas residence time decreases, less quenching is realized.

In some implementations, the chamber is purged with an inert gas or hydrogen gas prior to forming the activated gas. The purge can occur simultaneously with the formation of the oxygen and argon plasma. As well, the hydrogen gas may be flowed into the chamber before the oxygen and argon plasma is flowed from the remote plasma source or flowed simultaneously to mix with the oxygen and argon plasma over the substrate.

At operation 250, the method 200 further includes exposing the substrate to activated gas to oxidize the substrate surface to form an oxide film, such as silicon oxide layer 380 as shown in FIG. 3B. In some implementations, the silicon oxide layer is a conformal silicon oxide layer.

At operation, 260, the flow rate of argon is controlled to either increase or decrease the oxide deposition rate. It has been found by the inventors that flowing argon into either a remote plasma source or chamber slit valve generates high-energy argon species and these high-energy argon species prevent the recombination of oxygen radicals. Thus, the growth rate of the oxide film can be increased by increasing the flow of argon gas into the remote plasma source, which reduces oxygen radical recombination and provides increased oxygen radical concentration for oxide formation. Additionally, in some implementations where it is appropriate to reduce the growth rate of the oxide film, decreasing the flow of argon gas into the remote plasma source increases oxygen radical recombination, which despite increasing concentration of oxygen species, reduces the amount of oxygen radicals available for oxide film growth leading to a decreased growth rate. Thus, argon provides an independent knob of either increasing or decreasing oxide film growth rate for remote plasma oxidation processes. In addition, Ar addition can tune within wafer uniformity of oxidation independently from other parameters (pressure, flow, temperature, etc.).

Figure 4:
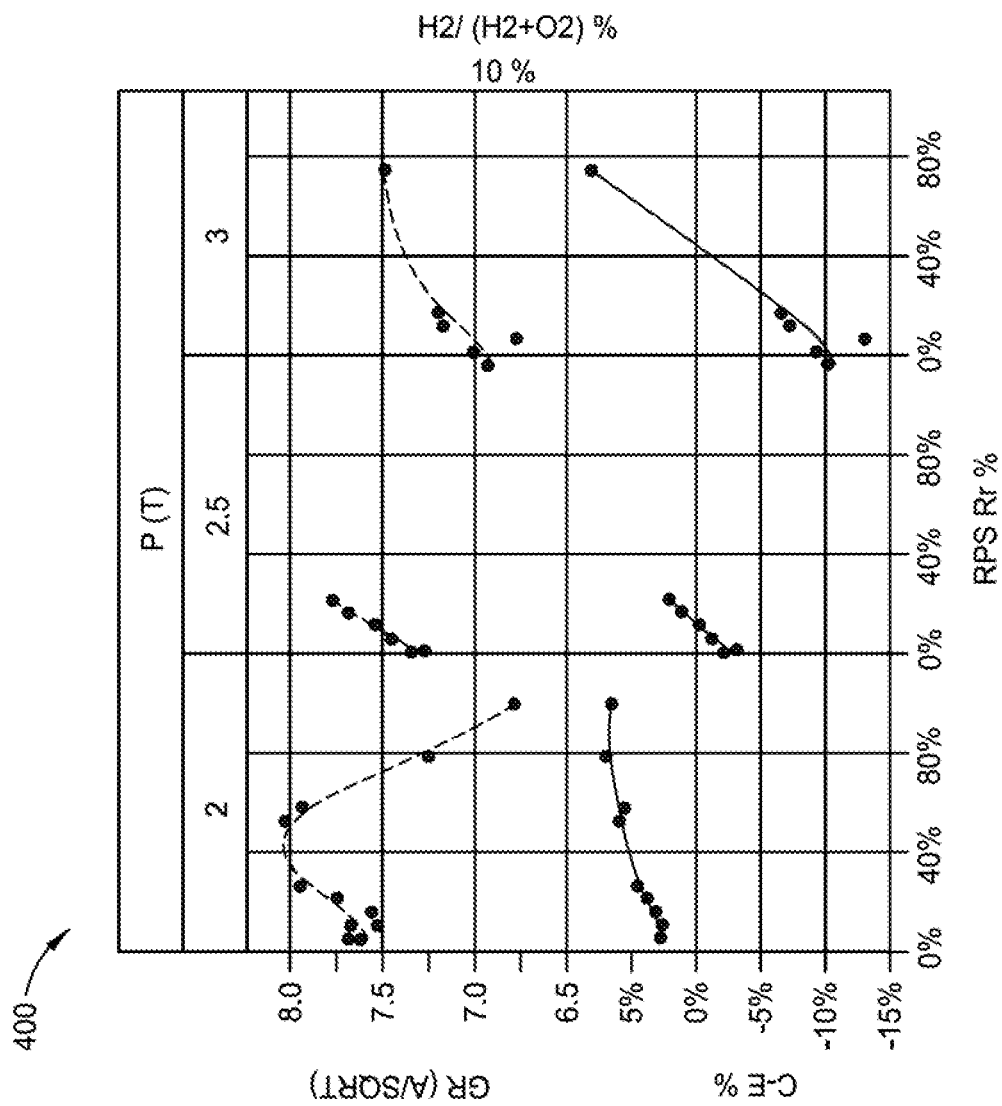
FIG. 4 is a graph depicting growth rate and center to edge uniformity of an oxide film formed according to implementations described herein.

FIG. 4 is a graph 400 depicting growth rate and center to edge uniformity of an oxide film formed according to implementations described herein. As depicted in FIG. 4, growth rate starts to decrease beyond 50% argon in the remote plasma. As further depicted in FIG. 4, the oxide growth rate with argon of approximately 15% is about 3% greater than oxide film grown without argon, for $H_2/(H_2+O_2)$ of 10%, despite apparent dilution of reaction precursor gases in the processing chamber when using argon. Not to be bound by theory, it appears that deactivation of activated species increases faster than overall concentration of reaction species (as opposed to non-reaction species such as argon) as argon concentration decreases, leading to an overall reduction in film growth rate as argon concentration decreases. Thus, film growth rate, in the methods described herein, has an inverse relation to argon flow rate, up to about 55 percent argon based on total argon plus oxygen species, all other conditions being equal. Beyond about 55 percent, a lesser benefit is realized. Additionally, conformality of the deposited film has a direct relationship to argon flow rate, since more argon reduces concentration gradient of active species in HAR features such as the high aspect ratio feature 340.

Figure 5:
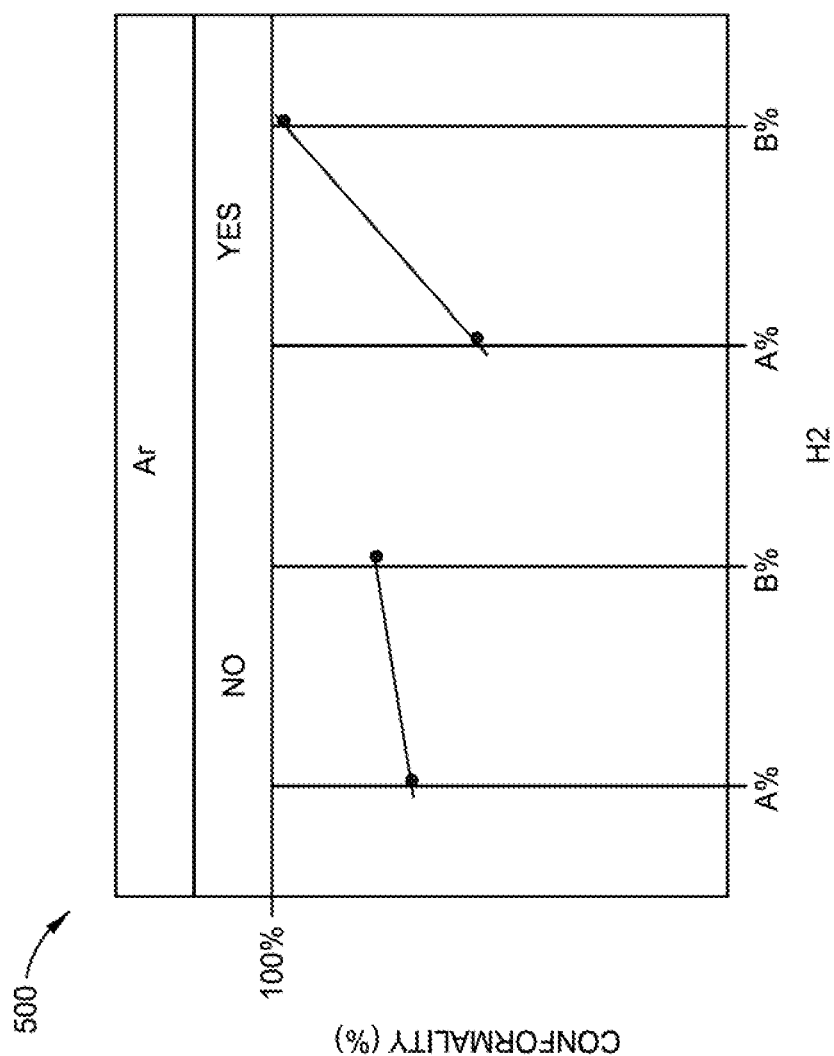
FIG. 5 is a graph depicting oxide conformality based on the percent of hydrogen gas and the presence or absence of argon.

FIG. 5 is a graph 500 depicting oxide conformality based on the percent of hydrogen gas and the presence or absence of argon. The portion of graph 500, which is labeled "No", was performed with hydrogen gas and oxygen gas only. The portion of the graph 500, which is labeled "Yes", was performed with hydrogen gas, oxygen gas, and argon gas. As depicted in graph 500, only certain percentages of hydrogen gas in the presence of argon will yield an improvement in conformality of the as-deposited oxide film.

Figure 6:
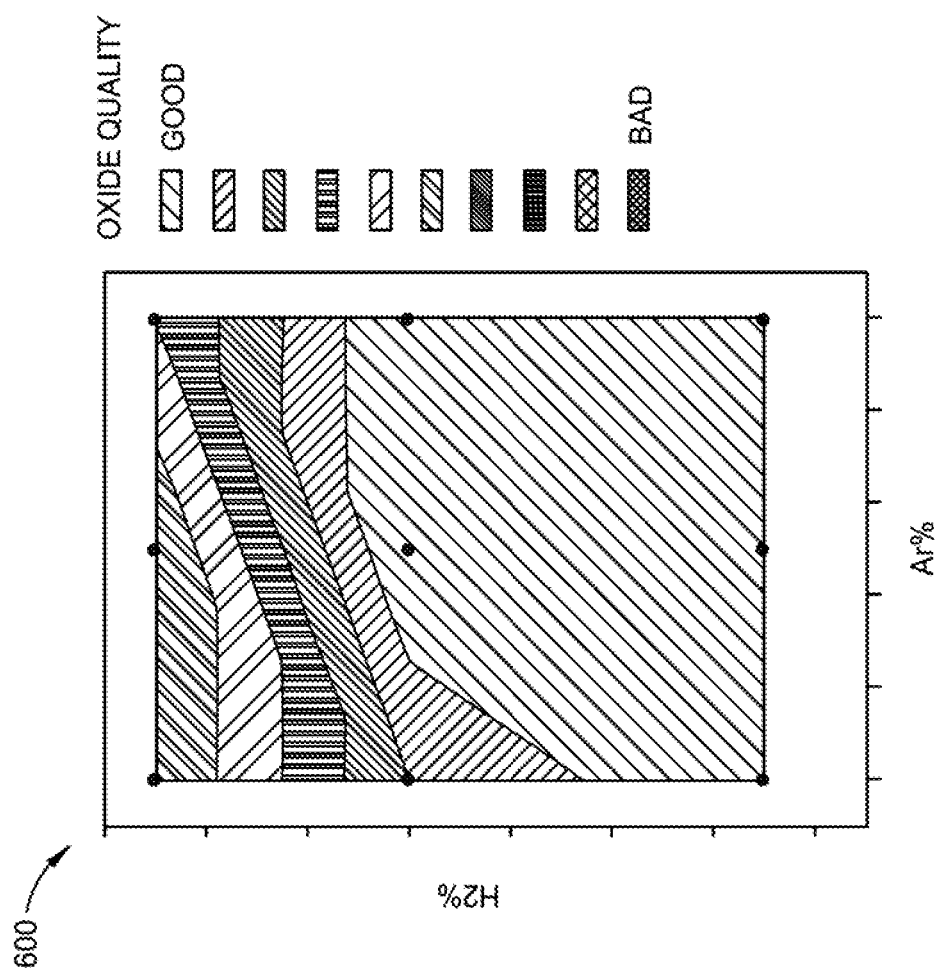
FIG. 6 is a graph depicting oxide quality based on the percent of hydrogen gas relative to the percent of argon gas.

FIG. 6 is a graph 600 depicting oxide quality based on the percent of hydrogen gas relative to the percent of argon gas. The graph 600 demonstrates that without argon, certain percentages of hydrogen gas can degrade oxide quality. Sufficient addition of argon gas can either eliminate or reduce the reduction in oxide quality that is present without argon gas.

In summary, some implementations described herein enable the growth of conformal oxide films (e.g., silicon oxides) within HAR structures. It has been found by the inventors that argon addition during some implementations of remote plasma oxidation can improve conformal oxidation growth while improving pattern loading. Not to be bound by theory but it is believed that the addition of argon gas reduces the recombination of oxygen radicals, which increases the concentration of oxygen radicals available for the plasma oxidation process. Thus, argon gas can be used to control the growth rate of an oxide film. For example, an increase in the flow of argon gas will typically yield an increase in the growth rate of the oxide film, whereas a decrease in the flow of argon gas will typically yield a decrease in the growth rate of the oxide film.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method for oxidation, comprising:
 positioning a substrate in a processing region of a processing chamber;
 flowing hydrogen gas into a precursor activator at a first flow rate, wherein the precursor activator is fluidly coupled with the processing region;
 flowing oxygen gas into the precursor activator at a second flow rate;
 flowing argon gas into the precursor activator at a third flow rate;
 generating a plasma in the precursor activator from the hydrogen gas, the oxygen gas, and the argon gas;
 flowing the plasma into the processing region; and
 exposing the substrate to the plasma to form an oxide film on the substrate, wherein a growth rate of the oxide film is controlled by adjusting the third flow rate.

2. The method of claim 1, further comprising increasing the third flow rate to increase the growth rate of the oxide film.

3. The method of claim 1, further comprising decreasing the third flow rate to decrease the growth rate of the oxide film.

4. The method of claim 1, wherein a ratio of the second flow rate to the third flow rate ($O_2$:Ar) is between about 1:1 and about 5:1.

5. The method of claim 1, further comprising flowing the hydrogen gas through the precursor activator and into the processing region prior to generating the plasma.

6. The method of claim 1, further comprising flowing the oxygen gas and/or the argon gas into the processing region prior to flowing the plasma into the processing region.

7. The method of claim 1, wherein a concentration of the argon gas in the precursor activator, based on a total amount of the argon gas, the oxygen gas, and the hydrogen gas, is between 20 percent and 50 percent.

8. The method of claim 7, wherein the substrate is maintained at a temperature between 700 degrees Celsius and 800 degrees Celsius and at a chamber pressure between about 2 Torr and about 3 Torr.

9. The method of claim 1, wherein the substrate comprises at least one of an exposed silicon nitride surface, an exposed polysilicon surface, an exposed alumina surface, an exposed crystalline silicon surface, and an exposed silicon oxide surface.

10. The method of claim 1, wherein the substrate is maintained at a temperature between 500 degrees Celsius and 1100 degrees Celsius.

11. The method of claim 10, wherein the processing region is maintained at a pressure between about 0.5 Torr and about 5 Torr.

12. The method of claim 1, wherein the substrate has a high aspect ratio feature formed thereon having an aspect ratio of 40:1 or greater and the oxide film is formed on faces that define the high aspect ratio feature.

13. The method of claim 12, wherein the high aspect ratio feature is formed in a film structure formed on the substrate, the film structure comprising a plurality of material layer stacks each comprising a silicon oxide layer and a silicon nitride layer.

14. A method for oxidation, comprising:
positioning a substrate in a processing region of a processing chamber;
flowing hydrogen gas into a precursor activator at a first flow rate from about 0.01 standard liters per minute (slm) to about 20 slm, wherein the precursor activator is fluidly coupled with the processing region;
flowing oxygen gas into the precursor activator at a second flow rate from about 0.01 slm to about 15 slm;
flowing argon gas into the precursor activator at a third flow rate;
generating a plasma in the precursor activator from the hydrogen gas, the oxygen gas, and the argon gas;
flowing the plasma into the processing region; and
exposing the substrate to the plasma to form an oxide film on the substrate, wherein a growth rate of the oxide film is controlled by adjusting the third flow rate from about 0.01 slm to about 15 slm, wherein the substrate is maintained at a temperature between 500 degrees Celsius and 1100 degrees Celsius and at a chamber pressure between about 1 Torr and about 10 Torr.

15. The method of claim 14, further comprising increasing the third flow rate to increase the growth rate of the oxide film.

16. The method of claim 14, further comprising decreasing the third flow rate to decrease the growth rate of the oxide film.

17. The method of claim 14, wherein a concentration of the argon gas in the precursor activator, based on a total amount of the argon gas, the oxygen gas, and the hydrogen gas, is between 20 percent and 50 percent.

18. The method of claim 14, further comprising flowing the oxygen gas through the precursor activator and into the processing region prior to generating the plasma.

19. The method of claim 18, further comprising flowing the argon gas through the precursor activator and into the processing region prior to generating the plasma.

20. The method of claim 19, wherein the oxygen gas and the argon gas are flowed into the processing region prior to generating the plasma for a duration between about 5 seconds and about 30 seconds.

* * * * *